United States Patent [19]

Komatsu et al.

[11] Patent Number: 5,373,478
[45] Date of Patent: Dec. 13, 1994

[54] NON-VOLATILE MEMORY BOARD

[75] Inventors: Katsuaki Komatsu; Atsushi Takahashi; Kazuhiko Tsuboi; Shinichi Nishi, all of Hino, Japan

[73] Assignee: Konica Corporation, Tokyo, Japan

[21] Appl. No.: 63,014

[22] Filed: May 17, 1993

[30] Foreign Application Priority Data

May 26, 1992 [JP] Japan ................... 4-133829
Sep. 11, 1992 [JP] Japan ................... 4-243453

[51] Int. Cl.⁵ ............................................. G11C 13/00
[52] U.S. Cl. ................................ 365/229; 365/63; 361/760; 361/807; 361/809; 257/916
[58] Field of Search ................ 365/229, 63; 361/760, 361/781, 784, 790, 807, 809; 257/916

[56] References Cited

U.S. PATENT DOCUMENTS

| | | | |
|---|---|---|---|
| 5,144,586 | 9/1992 | Faraci | 365/229 X |
| 5,187,564 | 2/1993 | McCain | 365/229 X |
| 5,251,179 | 10/1993 | Wittman | 365/229 X |
| 5,274,584 | 12/1993 | Henderson et al. | 365/229 X |

Primary Examiner—Do Hyum Yoo
Attorney, Agent, or Firm—Frishauf, Holtz, Goodman & Woodward

[57] ABSTRACT

A memory board includes a board, a RAM (random access memory), a back-up battery for supplying a back-up power to the RAM, and a switch to switch a power source from a main power to the back-up battery when the voltage of the main power drops below a predetermined value. The back-up battery is located at the same position where either the switch or the RAM is located and mounted to cover the switch or the RAM.

4 Claims, 6 Drawing Sheets

NON-VOLATILE MEMORY BOARD

BACKGROUND OF THE INVENTION

The present invention relates to a non-volatile memory board.

Conventionally, non-volatile memory boards are incorporated in various apparatuses, wherein the memory board has function to store essential data in the memory even when a power supply of the apparatus main body is cut. FIG. 1 shows a non-volatile memory board circuit. In FIG. 1, a static RAM 1, which will be called an SRAM, hereinafter, has an address bus A, a data bus D, and a control line C. Data is written in and read from the SRAM 1 through the address bus A, data bus D, and control line C, and the written data is stored in the SRAM 1. When a reading or writing operation is carried out, voltage of an external power supply supplied from the apparatus main body, which is a power supply for driving, is impressed upon the SRAM 1 as voltage $V_{cc}$. However, when voltage $V_{cc}$ is cut, data stored in the SRAM 1 is erased. Accordingly, a backup battery 2 for the SRAM 1, by which data stored in the SRAM 1 is held even when external power supply voltage is decreased lower than a predetermined value, is provided on the non-volatile memory board. A switching circuit 3 has function by which voltage of the external power supply and that of the battery 2 are inputted into the switching circuit 3, the external power supply voltage of the apparatus is detected, and the voltage of the battery 2 is impressed upon the SRAM 1 when the external power supply voltage is decreased lower than a predetermined value. Further, the switching circuit 3 has a function by which a writing inhibition signal of a low level (L) is outputted to the SRAM 1 in the case where the power supply of the apparatus is cut, and then the external power supply voltage is decreased lower than a predetermined value.

FIG. 2 is a timing chart showing the relation between the foregoing functions. Referring to FIG. 2, operations of the non-volatile memory board circuit will be explained as follows.

In FIG. 2, the power consumption due to the writing and reading operation of data into and from the SRAM 1 is large when the apparatus is operated, and therefore voltage a (for example, 5 V) of the external power supply is supplied to the SRAM 1 by the switching circuit 3. At this time, a signal b of a high level (H) is outputted from the switching circuit 3 into the SRAM 1, and then a data writing and reading operation can be carried out. When the external power supply is cut at a time $t_1$ and the voltage a is decreased lower than a predetermined value $V_S$ at a time $t_2$, the power supply for the SRAM 1 is switched to be supplied from the battery 2 by the switching circuit 3, so that the voltage $V_{CC}$ for the SRAM 1 is replaced with the voltage $V_{bat}$. Due to the foregoing, data stored in the SRAM 1 can be held. As for the non-volatile memory board, sometimes an operation, by which the board is detached from the apparatus, and data stored in the SRAM 1 is read out, is carried out. In this case, the potential of address/data terminals of the SRAM 1 is unstable. Therefore, when the external power supply is cut, a writing inhibition signal of a low level (L) is outputted from the switching circuit 3 so that data is not broken, and thereby the writing operation into the SRAM 1 is inhibited.

When the external power supply is turned on and the voltage a of the external power supply is increased more than a predetermined value $V_S$, the power supply for the SRAM 1 is replaced with the external power supply by the switching circuit 3, and after a short period of time, the signal b is a high level (H), and after that, the writing inhibition signal is removed at the time $t_4$.

Next, a conventional non-volatile memory board will be explained as follows.

FIGS. 5(A)–5(C) show an appearance of a conventional non-volatile memory board 10. FIG. 5(A) is a plan view of the board 10. FIG. 5(B) is a front view of the board 10. FIG. 5(C) is a side view of the board 10. The SOP type SRAM 1, the switching circuit 3 including integrated circuits, and the coin type battery 2 having electrode terminals 2a, 2b are disposed on a board 11. The battery 2 is soldered onto the board 11 at their electrode terminals 2a and 2b. The SRAM and the switching circuit 3 are soldered onto the board 11 at their respective terminals. The SRAM 1 is connected with parts mounted on the board 11 through the address bus A, data bus D, and signal line C which are formed by a wiring pattern on the board 11, and is also connected with the switching circuit 3 through the wiring pattern. A predetermined number of connector pins 12 are provided on an end portion of the board 11, so that the non-volatile memory board 10 can be freely inserted into, for example, a socket of the apparatus main body.

In this connection, in the switching circuit 3 on the conventional non-volatile memory board, an output terminal 13 for the writing inhibition signal to the SRAM 1 is not insulation-coated as shown in FIG. 6, and therefore, an operator's fingers 14 is likely to touch more than one of the output terminals 13 and a terminal of the battery 2 at the same time. Further, since the output terminal 13 is close to an input terminal from the external power supply, the input terminal from the battery 2, and the output terminal of the voltage $V_{CC}$ to the SRAM 1, these terminals are likely to come into contact with the output terminal 13 through the operator's fingers 14 at the same time. Accordingly, in the case where the non-volatile memory board 10 is detached from the apparatus main body for conveyance, when the operator's fingers touch both the positive electrode terminal 2a of the battery 2 and the terminal 13 for the writing inhibition signal of the SRAM 1 at the same time, the positive electrode terminal 2a of the battery 2 and the terminal 13 are short circuited through the fingers 14, and the signal b is a high level (H). Accordingly, the SRAM 1 is in a writable condition, and therefore there is a probability that problems are caused in which data stored in the memory is erased.

SUMMARY OF THE INVENTION

The object of the present invention is to solve the aforementioned conventional problems, and to provide a nonvolatile memory board structured in a manner that the occurrence of a short circuit between a terminal for a writing inhibition signal of an SRAM or a switching circuit, arid a terminal of a battery is prevented, and data erasing problems are not caused.

For this purpose, the present invention is structured in the following manner:

A non-volatile memory board comprises a static RAM that conducts writing and reading operations when voltage is impressed thereon by a power supply for drive; a back-up battery for the static RAM; and a switching circuit by which the power supply, by which voltage is impressed upon the static RAM, is switched from the power supply for drive to the back-up battery, and from which a writing inhibition signal is outputted to the static RAM when it is detected that voltage of the power supply for drive is decreased lower than a predetermined value, wherein one of the static RAM and the switching circuit is covered with the battery.

Further, the present invention is structured in the following manner:

A non-volatile memory board comprises a static RAM that conducts writing and reading operations when voltage is impressed thereon by a power supply for drive; a back-up battery for the static RAM; and a switching circuit by which the power supply, by which voltage is impressed upon the static RAM, is switched from the power supply for drive to the back-up battery, and from which a writing inhibition signal is outputted to the static RAM when it is detected that voltage of the power supply for drive is decreased lower than a predetermined value, wherein at least one of the static RAM and the switching circuit is directly equipped on the board under the condition of bare chips, and its peripheral surfaces are covered with insulating resin.

Further, the present invention may be structured in the following manner:

A non-volatile memory board comprises a static RAM that conducts writing and reading operations when voltage is impressed thereon by a power supply for drive; a back-up battery for the static RAM; and a switching circuit by which the power supply, by which voltage is impressed upon the static RAM, is switched from the power supply for drive to the back-up battery, and from which a writing inhibition signal is outputted to the static RAM when it is detected that voltage of the power supply for drive is decreased lower than a predetermined value, wherein one of the static RAM and the switching circuit is covered with the battery, the other is directly equipped on the board under the condition of bare chips, and its peripheral surfaces are covered with insulating resin.

Further, the present invention is structured in the following manner:

The switching circuit is provided under the condition that it is covered with the battery; the static RAM is connected with a wiring pattern provided on the board, by wire bonding on the board; and the peripheral surfaces of the static RAM provided under the condition of bare chips are covered with insulating resin.

Due to the foregoing structure, at least one of the static RAM and the switching circuit is covered with the battery, and therefore, the operator's fingers do not touch both the terminal for the writing inhibition signal and the terminal of the battery at the same time, so that the occurrence of a short circuit can be prevented.

Further, in the non-volatile memory board structured in the manner that at least one of the static RAM and the switching circuit is directly equipped on the board under the condition of bare chips, and its peripheral surfaces are covered with insulation resin, occurrence of the short circuit can be prevented, and further, the size of the board can be reduced.

Further, also in the non-volatile memory board structured in the manner that: one of the static RAM and the switching circuit is covered with the battery; and the other is directly equipped on the board under the condition of bare chips, and its peripheral surfaces are covered with insulating resin, the occurrence of the short circuit can be prevented.

DETAILED DESCRIPTION OF THE PREFERRED EMBODIMENT

Figure 1:
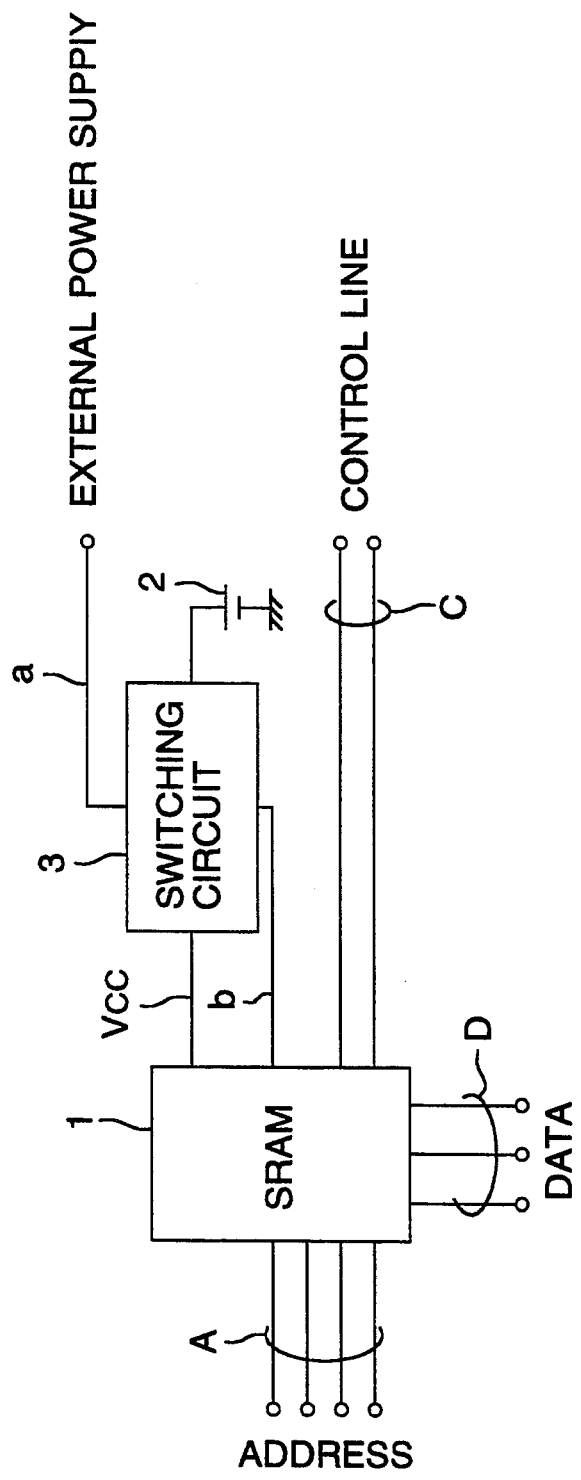
FIG. 1 is a circuit diagram of a non-volatile memory board.
Figure 2:
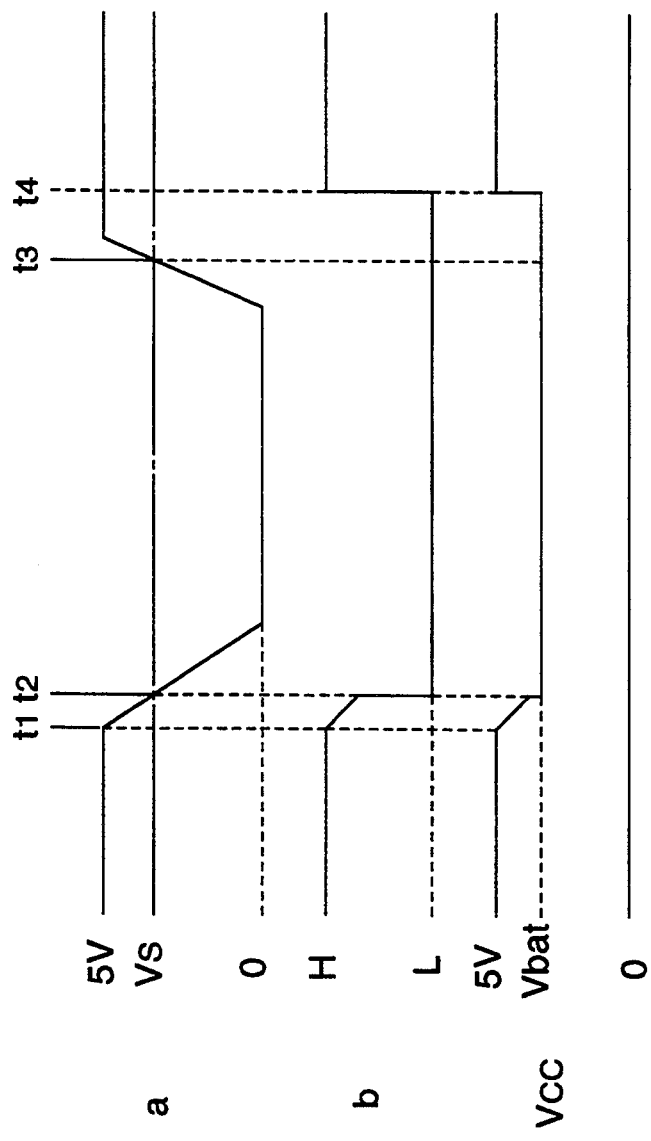
FIG. 2 is a timing chart of FIG. 1.
Figure 3:
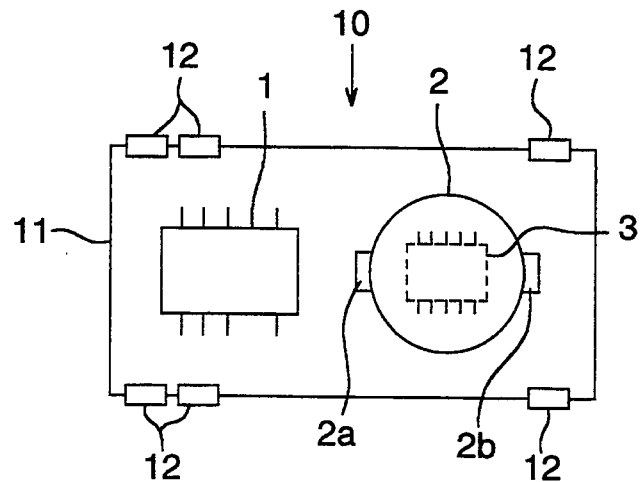
FIGS. 3(A)–3(C) are views showing the appearance of the first embodiment of the present invention.
Figure 3:
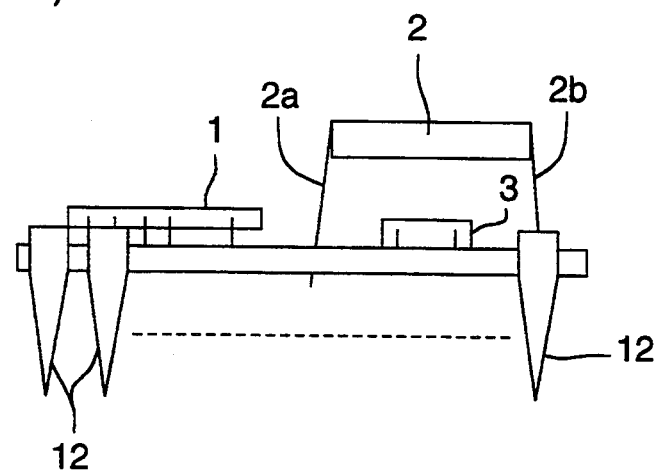
Figure 3:
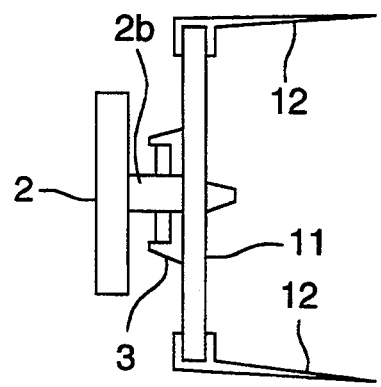
Figure 5:
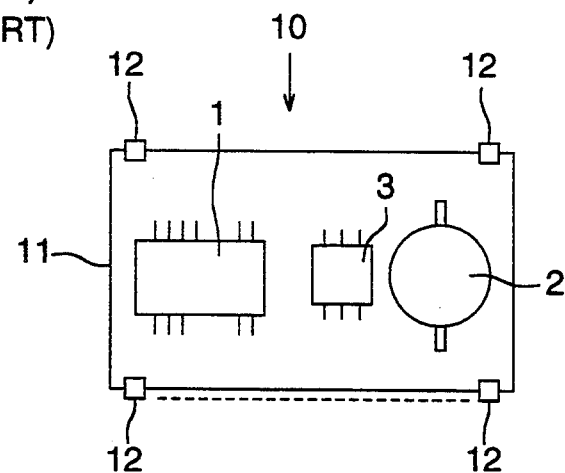
FIGS. 5(A)–5(C) are views showing the appearance of a conventional non-volatile memory board.
Figure 5:
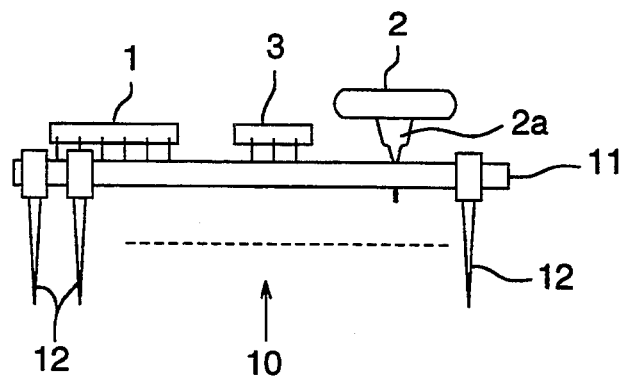
Figure 5:
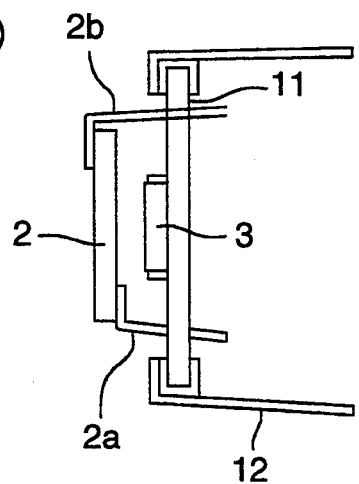
Figure 6:
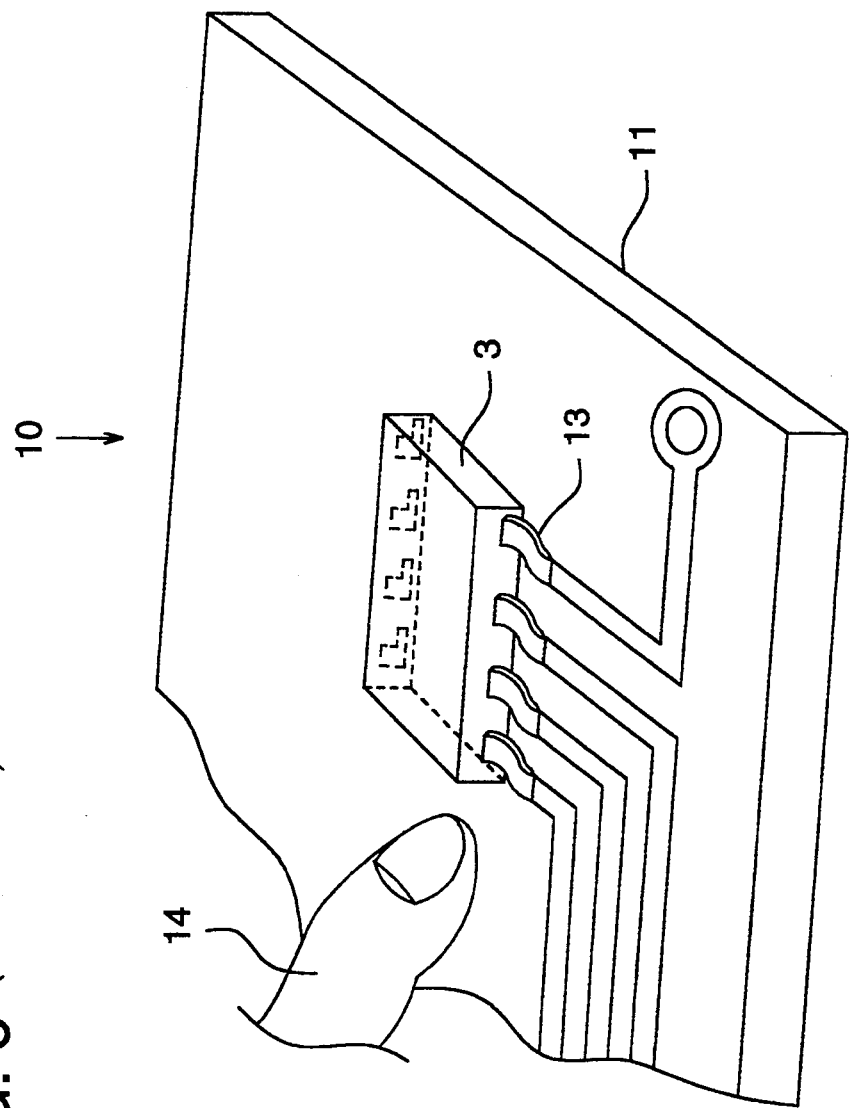
FIG. 6 is a schematic illustration of a conventional non-volatile memory board.

Referring to FIGS. 3(A)–3(B) and FIGS. 5(A)–and 4(B), an embodiment of the present invention will be described as follows. The same components as those in FIGS. 1, 2, 5(A)–5(C), and 6 will be denoted by the same symbols and numbers, and the explanation will be omitted.

FIG. 3(A) is a plan view of the first embodiment. FIG. 3(B) is a front view of the first embodiment. FIG. 3(C) is a side view of the first embodiment. The shape of an SRAM (a static RAM) 1 is of an SOP (small outline package) type. The SRAM 1 is disposed on a board 11, and terminals of the SRAM 1 are soldered to a wiring pattern provided on the surface of the board on which parts are provided. On the SRAM 1, ordinarily, an output terminal for a writing inhibition signal is provided separate from an input terminal for a power supply. A battery 2 has a terminal 2a for a positive electrode and a terminal 2b for a negative electrode, and the shape of the battery 2 is of a coin type. The battery 2 is disposed on the board in the manner that it covers a switching circuit 3, and terminals 2a, and 2b for the positive and negative electrodes are soldered on the board 11 for mounting. A coin type battery is effective for making the apparatus compact and for prevention of contact, however the present invention is not limited to the coin type battery, but the shape of the battery 2 may be of a cylindrical type or a paper type. A wiring operation between parts equipped on the board 11 is carried out using a wiring pattern provided on the board 11, and the surface of the board 11, excepting terminals of parts, is coated with insulating material.

According to the foregoing structure, when the battery 2 is mounted on the board 11 in the manner that the battery 2 covers the switching circuit 3, it is difficult that operator's fingers touch the output terminal for a writing inhibition signal of the switching circuit 3. Accordingly, when the non-volatile memory board 10 is inserted into or removed from a socket of the apparatus main body, or when the non-volatile memory board 10 is conveyed, the output terminal for the writing inhibition signal is not short-circuited with terminals for the external power supply or the battery 2, or the output terminals for voltage $V_{CC}$ supplied to the SRAM 1, and therefore, the writing inhibition signal is not canceled, so that the occurrence of an data erasing error can be prevented.

In this embodiment, the switching circuit 3 is mounted on the board in the manner that it is covered with the battery 2. However, the present invention is not limited to the specific embodiment, but the same effects can be obtained when the SRAM 1 is covered with the battery 2.

Next, the second embodiment will be described as follows.

The second embodiment is structured in the following manner: the switching circuit is covered with the battery; and the SRAM, close to the battery, is directly mounted on the board under the condition of bare chips.

Figure 4:
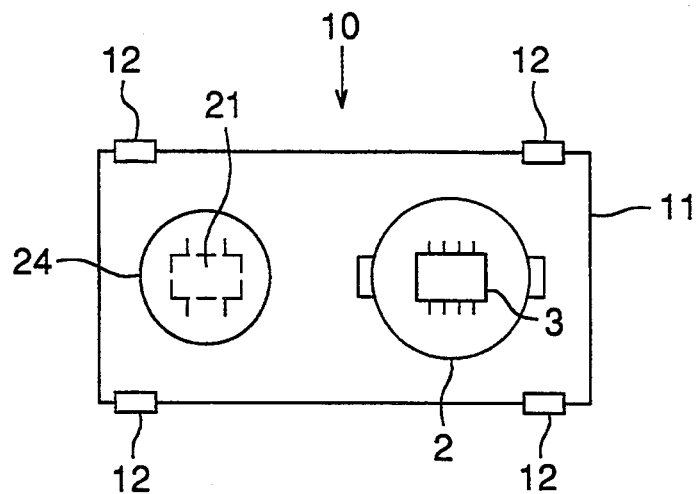
FIGS. 4(A)–4(B) are views showing the appearance of the second embodiment of the present invention.
Figure 4:
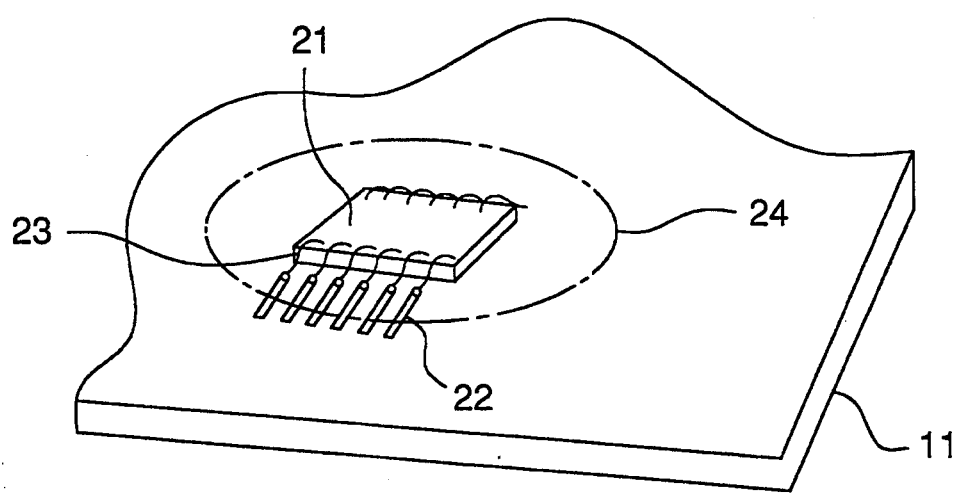

A bare chip is a chip which is not packaged. FIG. 4(A) is a view showing the SRAM bare chip provided at a predetermined position on the board, and FIG. 4(B) is an enlarged view of the main portion of FIG. 4(A). A SRAM bare chip 21 is provided at a predetermined position on the board 11, and is directly connected with a wiring pattern 22 by wires 23, that is, by a wire bonding method. After connection, peripheral surfaces of the SRAM bare chip 21 are covered with insulating resin 24 for sealing as shown by a dotted line in FIG. 4(B).

Due to the foregoing structure, since the switching circuit 3 is covered with the battery 2, and peripheral surfaces of the SRAM bare chip 21 are covered with insulating resin 24 for sealing, the operator's fingers can not touch the SRAM 21, so that the data erasing error can not be caused.

Further, when the bare chip SRAM 21 is mounted on the board as the SRAM, the non-volatile memory board can be made compact. In conventional memory boards, for a socket or a connector by which a board provided in the apparatus is connected with the non-volatile memory board, it is necessary to use a socket or a connector which is slightly larger than a standard size, because the socket or connector is used also for a single packaged IC. However, when the bare chip SRAM 21 is mounted on the board so that the non-volatile memory board. can be made compact, the foregoing conventional problems can be solved.

In the second embodiment, the electrodes have been connected by the wire bonding method, however, the same effects can be obtained by, for example, a flip-chip method, or a TAB (tape automated bonding) method.

In the second embodiment, the SRAM close to the battery has been mounted on the board under the condition of bare chips, however the present invention is not limited to this embodiment, but it may be structured in the following manner: the SRAM is covered with the battery; the switching circuit close to the battery is mounted on the board under the condition of bare chips; and its peripheral surfaces are covered with insulating resin, or it may be structured in the following manner that both the SRAM and the switching circuit are mounted on the board under the condition of bare chips, and their peripheral surfaces are covered with insulating resin.

As described above, according to the present invention, when one of the static RAM and the switching circuit is mounted on the board in the manner that it is covered with the battery, the occurrence of the short circuit between the terminal for the writing inhibition signal and that of the battery can be prevented, so that the occurrence of the erasing error of data stored in the static RAM can be prevented.

Further, also in the case where at least one of the static RAM and the switching circuit is mounted on the board under the condition of bare chips, and its peripheral surfaces are covered with insulation resin, the occurrence of the data erasing error caused by the short circuit can be prevented, and further, the board can be made compact.

Further, also in the case where one of the static RAM and the switching circuit is provided on the board in the manner that it is covered with the battery, the other is directly provided on the board under the condition of bare chips, and its peripheral surfaces is covered with insulating resin, the occurrence of the data erasing error caused by the short circuit can be completely prevented.

What is claimed is:

1. A memory board comprising: a board having:
   an electrical circuit mounted thereon, said electrical circuit including a power supply line;
   a RAM (random access memory) mounted on said board, said board being adapted to be incorporated in an apparatus from which an electrical main power is supplied to said RAM through said power supply line;
   a back-up battery for supplying a back-up power to said RAM;
   a switch mounted on said board;
   said switch including:
   a detection circuit to detect a voltage of said main power;
   a switching circuit for switching a power source for said RAM from said main power to said back-up battery when said detection circuit detects that a voltage of said main power drops below a predetermined value; and
   a signal circuit mounted on said board for providing an inhibition signal to said RAM so that said RAM is inhibited to receive a data; and wherein
   said back-up battery is located at a position of one of said switch and said RAM and is mounted to cover said one of said switch and said RAM.

2. The memory board of claim 1, wherein said back-up battery is located on the position of said switch and is mounted to cover said switch.

3. The memory board of claim 2, wherein said RAM is mounted on said board as a bare chip which is not enclosed in a package and an entire peripheral surface of said RAM is covered with an insulating resin.

4. A memory board comprising: a board having:
   an electrical circuit mounted thereon, said electrical circuit including a power supply line;
   a RAM (random access memory) mounted on said board, said board being adapted to be incorporated in an apparatus from which an electrical main power is supplied to said RAM through said power supply line;
   a back-up battery mounted on said board for supplying a back-up power to said RAM;
   a switch mounted on said board;
   said switch including:
   a detection circuit to detect a voltage of said main power;
   a switching circuit for switching a power source for said RAM from said main power to said back-up battery when said detection circuit detects that a voltage of said main power drops below a predetermined value; and
   a signal circuit mounted on said board for providing an inhibition signal to said RAM so that said RAM is inhibited to receive a data; and wherein
   said back-up battery is located at a position of one of said switch and said RAM and is mounted to cover said one of said switch and said RAM; and
   the other one of said switch and said RAM is mounted on said board as a bare chip which is not enclosed in a package and said other one of said switch and said RAM has an entire peripheral surface thereof covered with an insulating resin.

* * * * *